United States Patent
Atchley et al.

(10) Patent No.: US 10,742,165 B2
(45) Date of Patent: Aug. 11, 2020

(54) BYPASS MECHANISMS FOR ENERGY GENERATION SYSTEMS

(71) Applicant: SolarCity Corporation, San Mateo, CA (US)

(72) Inventors: Brian Edward Atchley, Petaluma, CA (US); David Molina, Oakland, CA (US); Steve Pisklak, Hockessin, DE (US); Johann Fritz Karkheck, Petaluma, CA (US); Greg Ball, Fairfax, CA (US)

(73) Assignee: SolarCity Corporation, San Mateo, CA (US)

( * ) Notice: Subject to any disclaimer, the term of this patent is extended or adjusted under 35 U.S.C. 154(b) by 288 days.

(21) Appl. No.: 15/647,213

(22) Filed: Jul. 11, 2017

(65) Prior Publication Data

US 2019/0020306 A1 Jan. 17, 2019

(51) Int. Cl.
*H02S 40/36* (2014.01)
*H01L 31/02* (2006.01)
(Continued)

(52) U.S. Cl.
CPC .......... *H02S 40/36* (2014.12); *H01L 31/0201* (2013.01); *H01L 31/042* (2013.01);
(Continued)

(58) Field of Classification Search
CPC .......... H02S 40/00; H02S 40/32; H02S 40/34; H02S 40/36; H02S 40/25; H02S 40/23; H02H 7/20; H01L 31/0201; H01L 31/042
See application file for complete search history.

(56) References Cited

U.S. PATENT DOCUMENTS 9,178,353 B2 11/2015 Robbins
9,190,839 B2 11/2015 Johnston et al.
(Continued)

FOREIGN PATENT DOCUMENTS

WO 2015/150471 A1 10/2015

OTHER PUBLICATIONS

Diaz-Dorado, E., et al., "Influence of the shadows in photovoltaic systems with different configurations of bypass diodes," Power Electronics Drives Automation and Motion (SPEEDAM), 2010 International Symposium, Pisa, Italy, Jun. 2010, pp. 134-139.
(Continued)

*Primary Examiner* — Matthew T Martin
(74) *Attorney, Agent, or Firm* — Dentons US LLP

(57) ABSTRACT

A photovoltaic (PV) module sub-circuit for an energy generation system includes a plurality of PV sub-modules coupled together via external cables, the plurality of PV sub-modules includes a first PV sub-module and a second PV sub-module, a negative output terminal coupled to the first PV sub-module, a positive output terminal coupled to the second PV sub-module, and a plurality of connectors external to the PV sub-modules and coupling the PV sub-modules together to form the PV module sub-circuit. The sub-circuit further includes a bypass mechanism including a first terminal coupled to only the negative output terminal and the first PV sub-module, and a second terminal coupled to only the positive output terminal and the second PV sub-module, the bypass mechanism configured to prevent current flow in a first direction and allow current flow in a second direction opposite of the first direction.

19 Claims, 8 Drawing Sheets

(51) Int. Cl.
  *H02H 7/20* (2006.01)
  *H02S 20/25* (2014.01)
  *H02S 40/34* (2014.01)
  *H02S 40/32* (2014.01)
  *H02S 20/23* (2014.01)
  *H01L 31/042* (2014.01)

(52) U.S. Cl.
  CPC .............. *H02H 7/20* (2013.01); *H02S 20/23* (2014.12); *H02S 20/25* (2014.12); *H02S 40/32* (2014.12); *H02S 40/34* (2014.12)

(56) References Cited

U.S. PATENT DOCUMENTS

| | | | |
|---|---|---|---|
| 9,219,171 | B2 | 12/2015 | Moslehi |
| 9,293,619 | B2 | 3/2016 | Moslehi et al. |
| 9,324,885 | B2 | 4/2016 | Avrutsky |
| 2010/0051082 | A1 | 3/2010 | Kang et al. |
| 2012/0060895 | A1 | 3/2012 | Rubin et al. |
| 2012/0298166 | A1 | 11/2012 | Chen et al. |
| 2013/0033113 | A1* | 2/2013 | Huang .................. H02J 3/385 307/77 |
| 2013/0192657 | A1 | 8/2013 | Hadar et al. |
| 2014/0102507 | A1 | 4/2014 | Young |
| 2014/0305485 | A1 | 10/2014 | Kuramoto et al. |
| 2015/0326177 | A1 | 11/2015 | Koehler |
| 2015/0340527 | A1 | 11/2015 | Motonaga et al. |
| 2016/0308082 | A1 | 10/2016 | Ishii et al. |
| 2017/0018670 | A1 | 1/2017 | Bende et al. |

OTHER PUBLICATIONS

Johnson, Jay et al., "Differentiating Series and Parallel Photovoltaic Arc-Faults," Conference Paper in Conference Record of the IEEE Photovoltaic Specialists Conference (PVSC, Jun. 2012, 8 pages.

* cited by examiner

BYPASS MECHANISMS FOR ENERGY GENERATION SYSTEMS

BACKGROUND

In recent years, climate change concerns, reduction in costs, governmental initiatives, and other factors have driven a rapid rise in the adoption of distributed renewable energy generation systems (i.e., systems that generate energy using renewable resources such as solar, wind, fuel cells, geothermal, etc.) at residential and non-residential sites. Solar energy generation systems, in particular, have been very popular due to numerous advantages over other renewable and non-renewable energy sources. Solar energy generation systems include photovoltaic (PV) modules that generate power from the sun, and can provide the generated power to a utility grid or to one or more on-site loads. Some solar energy generation systems can store energy from the PV modules and/or utility grid in a battery for future use, and can receive power from the utility grid and re-route power to the one or more loads without having to use power generated from the PV modules or from energy stored in the battery.

As with any electrical system, electrical components are connected together via electrical connections. These electrical connections can be formed from a variety of different wires/cables and connectors. Successful operation of an energy generation system largely relies on the ability of its electrical connections to route power between the electrical components in the energy generation system without fault. Furthermore, the electrical components themselves also rely on the ability of the electrical connections to route power without fault. Some issues can occur when one or more cables are damaged during handling or installation of the energy generation system, or damaged from excessive wear and tear. These damaged areas can cause an electrical disturbance that can immediately cause, or build up to over time, a thermal event such as arcing or overheating when power is transmitted through the cable. The occurrence of such a thermal event can result in damage to one or more electrical components of the energy generation system. Thus, improvements to energy generation systems to minimize arcing are desired.

SUMMARY

Various embodiments of the disclosure provide a bypass mechanism for energy generation systems that minimizes the occurrence of thermal events in cables/connectors by bypassing culprit components in the event of an electrical disturbance. The bypass mechanism can be any suitable electrical device and/or circuitry configured to prevent the flow of current in one direction, while allowing the flow of current in the opposite direction to bypass the culprit component and avoid a thermal event upon an occurrence of an electrical disturbance.

In some embodiments a photovoltaic (PV) module sub-circuit for an energy generation system includes a plurality of PV sub-modules coupled together via external cables, the plurality of PV sub-modules comprising a first PV sub-module and a second PV sub-module; a negative output terminal coupled to the first PV sub-module of the plurality of PV sub-modules; a positive output terminal coupled to the second PV sub-module of the plurality of PV sub-modules; a plurality of connectors external to the PV sub-modules and coupling the PV sub-modules together to form the PV module sub-circuit so that a current flows through the connectors and the external cables during energy generation; and a bypass mechanism comprising a first terminal coupled to only the negative output terminal and the first PV sub-module, and a second terminal coupled to only the positive output terminal and the second PV sub-module, the bypass mechanism configured to prevent current flow in a first direction and allow current flow in a second direction opposite of the first direction when a voltage across the bypass mechanism increases above a voltage threshold to prevent an occurrence of a thermal event.

The bypass mechanism can be a passive electrical device. The passive electrical device can be a diode. In some embodiments, an anode of the diode is coupled to the negative output terminal and a cathode of the diode is coupled to the positive output terminal. The bypass mechanism can be an active electrical device. The bypass mechanism can be a power electronic circuit. In certain embodiments, the power electronic circuit includes a sensor, a switch, and a controller coupled to the sensor and the switch and configured to control the switch based on data received from the sensor. The power electronic circuit can be incorporated in an optimizer for performing maximum power point tracking of power outputted by the plurality of PV sub-modules. The PV sub-module can include at least two PV cells. The PV sub-module can be a PV shingle that has a structure and an appearance of a roof shingle. The thermal event can be an occurrence of an electrical arcing or overheating.

In some embodiments, a building-integrated PV energy generation system includes a plurality of PV module sub-circuits coupled together and configured to output power to a pair of terminals. Each PV module can include a plurality of PV sub-modules coupled together via external cables, the plurality of PV sub-modules comprising a first PV sub-module and a second PV sub-module; a negative output terminal coupled to the first PV sub-module of the plurality of PV sub-modules; a positive output terminal coupled to the second PV sub-module of the plurality of PV sub-modules; a plurality of connectors external to the PV sub-modules and coupling the PV sub-modules together to form the PV module sub-circuit so that a current flows through the connectors and the external cables during energy generation; and a bypass mechanism comprising a first terminal coupled to only the negative output terminal and the first PV sub-module, and a second terminal coupled to only the positive output terminal and the second PV sub-module, the bypass mechanism configured to prevent current flow in a first direction and allow current flow in a second direction opposite of the first direction when a voltage across the bypass mechanism increases above a voltage threshold. The building-integrated PV energy generation system can also include an inverter coupled to the PV module sub-circuit via the pair of terminals and configured to receiver power from the PV module sub-circuit.

The building-integrated PV energy generation system can further include a system bypass mechanism coupled between the pair of terminals. The bypass mechanism can be a diode. In certain embodiments, an anode of the diode is coupled to the negative output terminal and a cathode of the diode is coupled to the positive output terminal. The bypass mechanism can be a power electronic circuit. The power electronic circuit can include a sensor, a switch, and a controller coupled to the sensor and the switch and configured to control the switch based on data received from the sensor. The PV sub-module can include at least two PV cells. The PV sub-module can be a PV roof tile that has a structure and an appearance of a roof tile. The thermal event can be an occurrence of an electrical arcing or overheating.

A better understanding of the nature and advantages of embodiments of the present invention may be gained with reference to the following detailed description and the accompanying drawings.

DETAILED DESCRIPTION

Solar energy generation systems according to embodiments of the disclosure can include a bypass mechanism to minimize the occurrence of thermal events for PV module sub-circuits in an energy generation system. In such systems, a bypass mechanism can be configured to allow current to flow in one direction, while preventing the flow of current in an opposite direction. The bypass mechanism can be any suitable electrical device and/or circuitry configured to allow the flow of current in one direction and prevent the flow of current in the opposite direction. As an example, the bypass mechanism can be an active or a passive electrical device, as will be discussed in detail further herein. By allowing current to flow in one direction, a build-up of voltage from an increase in resistance caused by an electrical disturbance can be diverted through the bypass mechanism so that it does not build up to the point of a thermal event.

I. PV Systems

A solar energy generation system includes an energy generation device, e.g., an array of PV modules connected together on one or more strings, for generating direct current (DC) power from the sun, one or more PV string inverters for converting the DC power from the strings to alternating current (AC) power, and physical interfaces for feeding into the utility grid and/or off-grid outputs—typically on the load side of the utility meter, between the meter and the customer's main electrical panel. The solar energy generation system provides excess AC power/energy back to the utility grid, resulting in cost benefits to the customer and/or resulting in an offset of the total amount of grid supplied electricity by the customer. The solar energy generation system can also route power from the utility grid to one or more loads through the inverter at the customer site in a back-up load panel.

Figure 1:
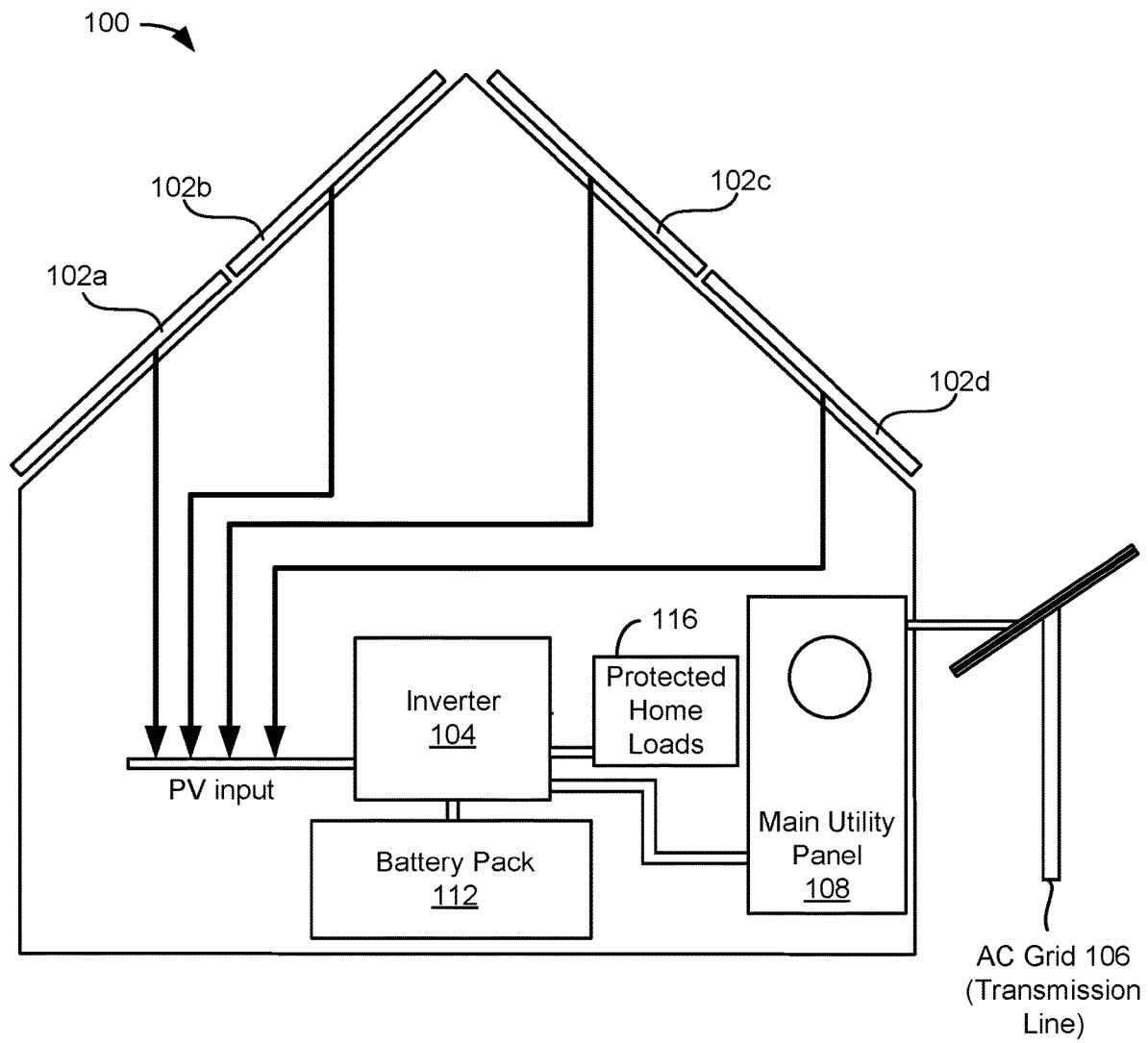
FIG. 1 is a simplified diagram illustrating an implementation of an energy system at an installation site.

FIG. 1 is a simplified diagram illustrating an implementation of energy system 100 at an installation site. As shown, energy storage system 100 is a PV system that includes PV modules 102a-d for generating DC power and PV grid-tied string inverter 104 for converting the generated DC power to AC power for feeding into AC utility grid 106 through a main utility panel 108. PV modules 102a-d can include one or more PV sub-modules that are arranged in array(s)/strings and are capable of generating DC voltage from photons emitted from a light source such as the sun. Each PV sub-module is different from a typical PV module in that it is smaller and can include only a few cells, such as two to five cells for generating DC voltage from the sun. A group of PV sub-modules can provide voltage that is equivalent to a typical PV module. In some cases, a PV sub-module can be a PV shingle or roof tile. PV shingles or roof tiles mimic the structure and appearance of a roof shingle or roof tile, and can be configured to generate DC voltage from the sun. In some embodiments, PV sub-modules can be connected together via a plurality of wires and/or connectors that are protected by a bypass mechanism, as will be discussed further herein.

Inverter 104 can include a DC-to-DC (buck and/or boost) converter for stepping up/down the received DC power from PV modules 102a-d to a suitable level for inversion, and a DC-to-AC inverter for converting the DC power to AC power for outputting to AC grid 106. Inverter 104 can also include a capacitor bank coupled between power lines routing power from the DC-to-DC converter to the DC-to-AC inverter for power stabilization purposes. In some embodiments, the DC-to-DC conversion may take place on the roof in the form of PV optimizers. In certain embodiments where strings of PV modules are long enough to provide high voltage sufficient for conversion on their own, a DC-to-AC micro-inverter can be implemented in PV system 100. The micro-inverter can include a DC-to-DC converter and a DC-to-AC inverter, and can be installed on the roof at or near each module, instead of at the end of a string of modules like PV string inverter 104.

PV system 100 may also include battery pack 112 for storing and discharging power/energy. Battery pack 112 may be any lead-acid or advanced lead-acid or lithium-ion or flow battery or organic battery pack or the like. Power discharged from battery pack 112 may be provided to an internal or external storage inverter, which can include a DC-to-DC converter for stepping up/down DC voltage provided by battery pack 112 to a suitable level for inversion during charging/discharging processes.

Back-up loads, e.g., protected home loads 116, can be an entire set, or a subset of the entire set, of loads for a customer site. For instance, protected home loads 116 may be certain loads that are considered to be more important that other loads during power outage. As an example, for a residential customer site, protected home loads 116 may be a refrigerator, air conditioning unit, heater unit, water pump, sewer pump and/or other loads important for human survival, whereas loads that are not considered back-up loads—but are still part of the entire set of loads—may include standard power outlet circuits supplying power to ancillary devices like television sets, a desk lamps, nightstand lights, and the like. For a commercial customer site, protected home loads 116 may be a server bay, information technology infrastructure devices, and other loads important for business sustainability during a power outage, whereas loads that are not considered protected home loads 116 may be non-critical light circuits supplying power to hallway lights, bathroom lights, desk lamps, and the like.

II. PV Modules and PV Sub-Modules

Utilizing PV sub-modules for generating DC power often results in the need for a greater number of wires and connectors to couple the PV sub-modules together as well as to couple the PV sub-modules to other components in the energy generation system relative to conventional roof top solar using full sized modules. Increasing the number of wires and connectors can increase the chances of electrical disturbances in the energy generation system due to faulty connections, frayed wires from physical stresses, and any other issues caused by the use and installation of connectors. This notion can be understood with a brief comparison between PV modules and PV sub-modules discussed herein with respect to FIGS. 2A-2B and 3A-3B.

A. PV Modules

Figure 2A:
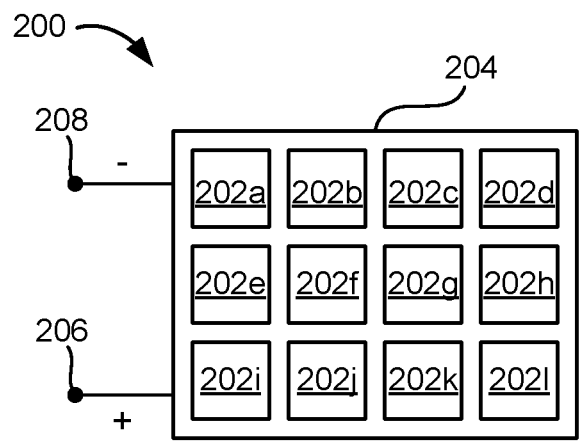
FIG. 2A is a simplified diagram illustrating an exemplary PV module including 12 PV cells.
Figure 2B:
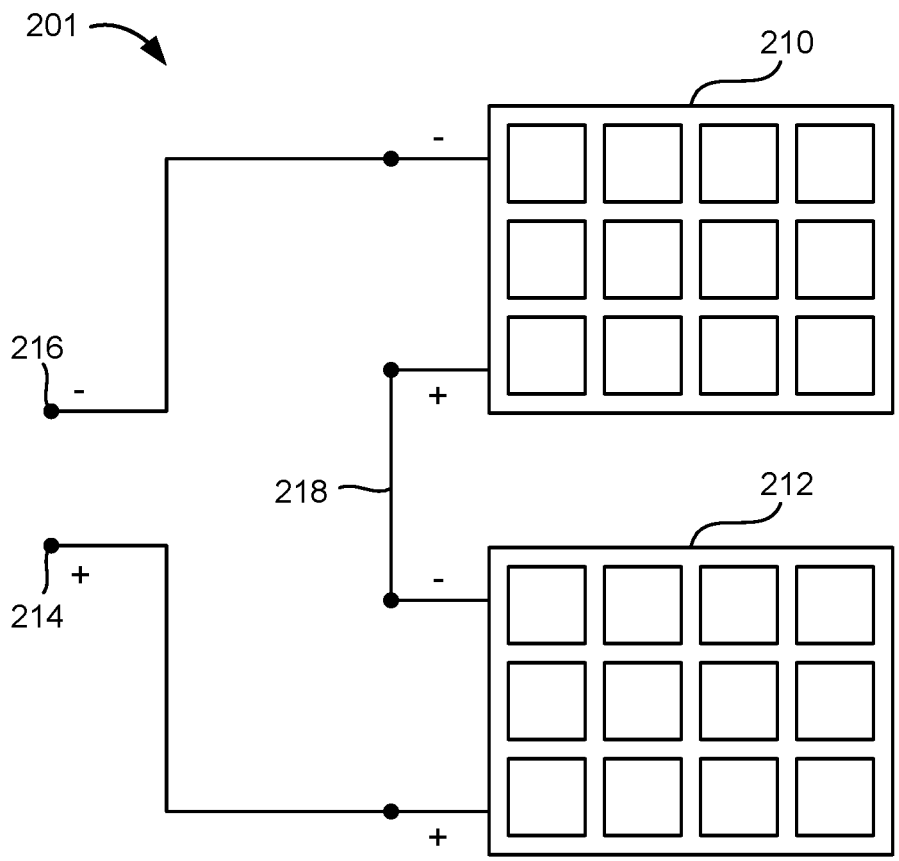
FIG. 2B is a simplified diagram illustrating a string configuration of PV modules for an energy generation system.

FIG. 2A is a simplified diagram illustrating an exemplary PV module 200 including 12 PV cells 202a-1. For ease of illustration only, module 200 contains only 12 PV cells, however, it should be appreciated that conventional full size PV modules typically contain between 60 and 72 individual modules divided internally into equal sized sub-strings. PV module 200 includes an enclosure 204 for housing all 12 PV cells 202a-1, as well as for housing all of the connections between PV cells 202a-1 such that only a positive output terminal 206 and a negative output terminal 208 are exposed outside of the module to couple PV module 200 to other components in an energy generation system. Because PV cells 202a-1 and their connections are housed within enclosure 204, the connections come pre-assembled and do not require an installer to separately couple PV cells 202a-1 together when the PV module is installed in a string configuration for an energy generation system, as shown in FIG. 2B. Rather, external connections are made at the module-to-module level only.

FIG. 2B is a simplified diagram illustrating a string configuration 201 of PV modules 210 and 212 for an energy generation system. Each PV module 210 and 212 can include a plurality of PV cells as discussed herein with respect to FIG. 2A. PV modules 210 and 212 can be coupled in a series configuration so that the voltages provided by both PV modules 210 and 212 can aggregate and provide a greater output voltage. DC voltage generated by PV modules 210 and 212 can be outputted to an inverter (e.g., inverter 104 in FIG. 1) for converting to AC voltage or to an optimizer before outputting to the inverter, which can then be outputted to one or more loads or the AC grid, as discussed herein with respect to FIG. 1. When installed in the energy generation system, PV modules 210 and 212 are coupled together via external cable 218 and then both PV modules 210 and 212 are connected to the inverter via output terminals 214 and 216. As can be understood in FIG. 2B, the external connectors include cables for coupling PV modules 210 and 212 to each other and to the inverter. External connectors are not needed for the PV cells within each module. In contrast to PV module 200 in FIG. 2, utilizing PV sub-modules often requires the need for a greater number of external connectors for coupling the PV sub-modules together, as groups of PV sub-modules are connected together to form PV module sub-circuits, which is discussed herein with respect to FIG. 3A.

A. PV Sub-Modules

Figure 3A:
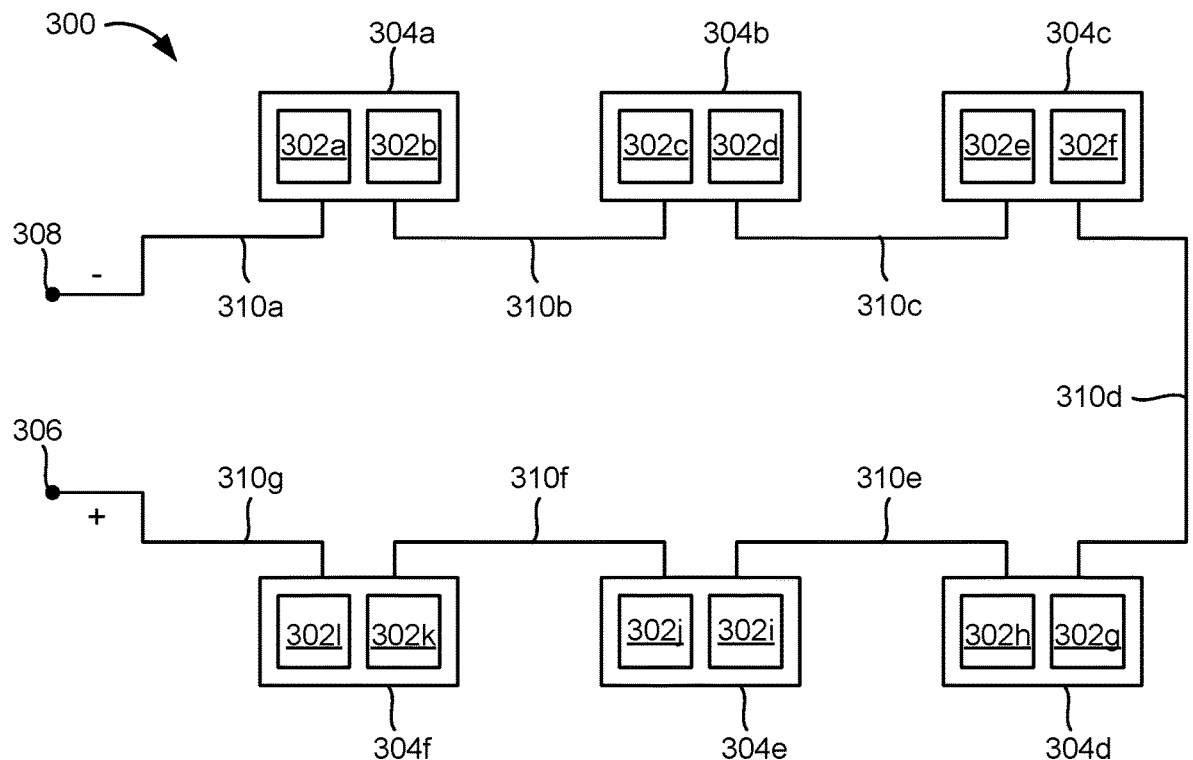
FIG. 3A is a simplified diagram illustrating an exemplary PV module sub-circuit including a plurality of PV sub-modules that house one or more PV cells, according to some embodiments of the present disclosure.

FIG. 3A illustrates an exemplary PV module sub-circuit 300 including a plurality of PV sub-modules 304a-f, according to some embodiments of the present disclosure. As shown in FIG. 3A, PV sub-modules 304a-f can house PV cells 302a-1, where each PV sub-module 304a-f can house two PV cells. Although FIG. 3A shows each PV sub-module as housing only two PV cells, embodiments are not so limited. Other configurations can have PV sub-modules that include more or less than two PV cells. For instance, some embodiments can have PV sub-modules that house three or more PV cells.

As shown in FIG. 3A, PV sub-modules 304a-f can be coupled together in a series configuration. By coupling PV sub-modules 304a-f in the series configuration, output voltages of each PV sub-module can aggregate to form a greater output voltage as a whole, and be outputted via positive output terminal 306 and negative output terminal 308. Although string configuration 301 shows a series configuration, it is not intended to be limiting, and that other embodiments can have different configurations, such as a parallel configuration or a parallel-and-series configuration. String configuration 301 can depend on the design of the PV system.

In comparison with PV module 200 in FIG. 2A, PV module sub-circuit 300 can have the same number of PV cells 302a-1 so that PV module sub-circuit 300 outputs the same aggregate voltage as PV module 200 at positive and negative output terminals 306 and 308, respectively. Alternatively, PV module sub-circuit 300 is one of many identical PV module sub-circuits that can combine to output the same voltage as PV module 200. Contrasting with PV module 200, however, PV cells 302a-1 of PV module sub-circuit 300 can be housed in a plurality of separate housings that are coupled together via a plurality of external connections 310a-310g (e.g., wires, cables, and/or plug-and-socket connectors). Thus, when more than one PV module sub-circuit 300 is coupled together in an energy generation system, a greater number of external cables are used when compared to the number used for typical PV modules where PV cells are housed within a single enclosure.

Figure 3B:
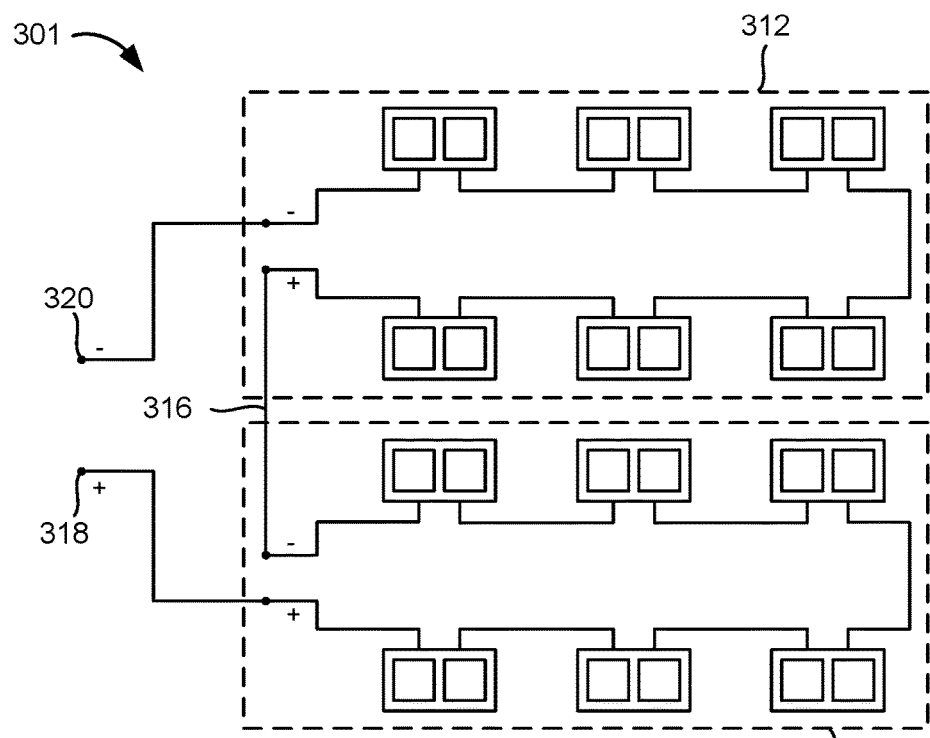
FIG. 3B is a simplified diagram illustrating a string configuration of PV module sub-circuits including a plurality of PV sub-modules for an energy generation system, according to some embodiments of the present disclosure.

FIG. 3B is a simplified diagram illustrating a string configuration 301 of PV module sub-circuits 312 and 314 for an energy generation system. Similar to PV module sub-circuit 300, each PV module sub-circuit 312 and 314 can include a plurality of PV sub-modules, where each PV sub-module includes at least one PV cell as discussed herein with respect to FIG. 3A. PV module sub-circuits 312 and 314 can be coupled in a string so that the voltages provided by both PV module sub-circuits 312 and 314 can aggregate and provide a greater output voltage than an output voltage without aggregation. DC voltage generated by PV module sub-circuits 312 and 314 can be outputted to an inverter for converting to AC voltage or to an optimizer for performing maximum power point tracking (MPPT) before outputting to the inverter, which can then be outputted to one or more loads or the AC grid, as discussed herein with respect to FIG. 1.

When installed in the energy generation system, PV module sub-circuits 312 and 314 are coupled together via external cable 316 and then both PV module sub-circuits 312 and 314 are connected to the inverter via output terminals 318 and 320. As can be understood in FIG. 3B, in addition to cable 316 that connects PV module sub-circuits 312 and 314 together, embodiments also include additional cables that connect the PV sub-modules of each respective PV module sub-circuit together in the string configuration discussed herein with respect to FIG. 3A. Thus, in contrast to conventional PV modules 200, 210, and 212 in FIGS. 2A and 2B, utilizing PV sub-modules and sub-circuits often requires the need for a greater number of external connectors for coupling the PV sub-modules together. The greater number of external connectors can increase the chances of electrical disturbances due to faulty connections, frayed wires from physical stresses, and any other issues caused by the use and installation of connectors. To minimize the chances of arcing and electrical failure even with the greater number of external connectors, bypass mechanisms can be implemented in the energy generation system, as will be discussed further herein.

Figure 4A:
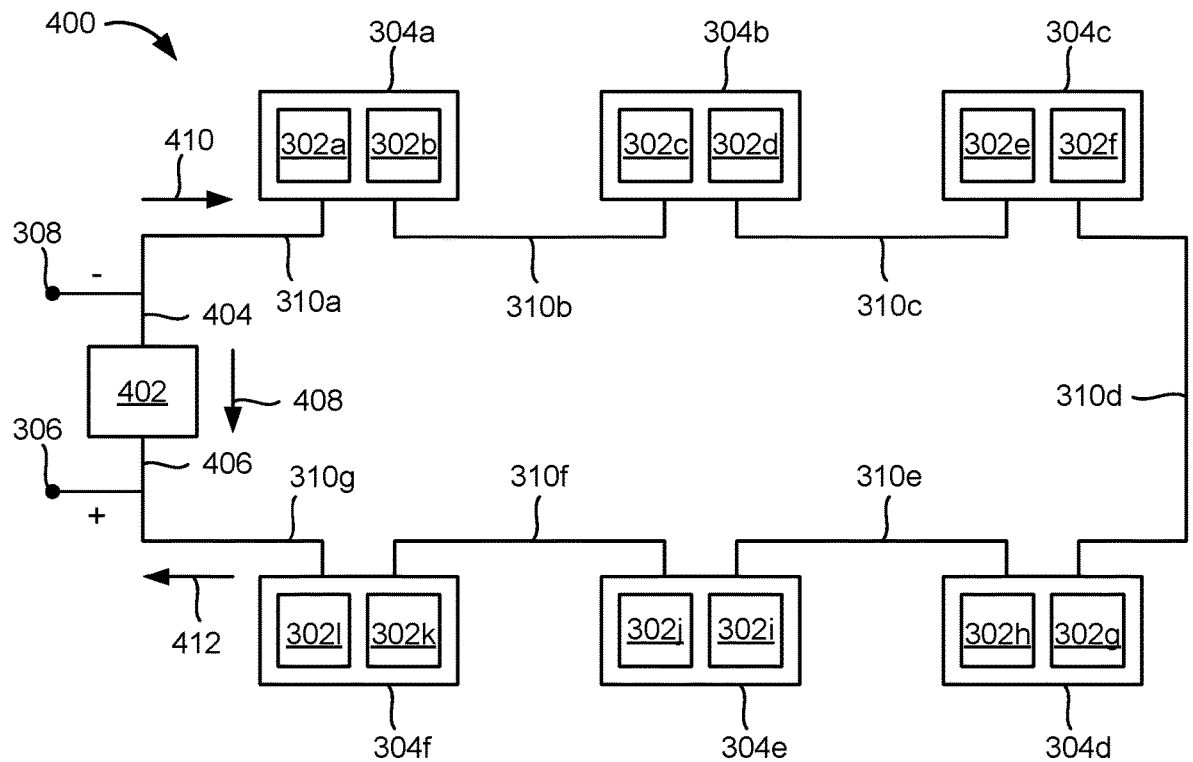
FIG. 4A is a simplified diagram illustrating an exemplary PV module sub-circuit having a plurality of PV sub-modules and a bypass mechanism, according to some embodiments of the present disclosure.

III. Bypass Mechanism for Protecting Wiring and Electrical Components of PV Module Sub-Circuits According to some embodiments of the present disclosure, an energy generation system can include a bypass mechanism for each PV module sub-circuit to minimize the occurrence of arcing, electrical damage, and/or thermal damage (i.e., damage from overheating) caused by external connectors and connections within each PV module sub-circuit. FIG. 4A is a simplified diagram illustrating an exemplary PV module sub-circuit 400 having a bypass mechanism 402 according to some embodiments of the present disclosure.

In some embodiments, bypass mechanism 402 can be coupled between positive and negative output terminals 306 and 308 of PV module sub-circuit 400. For instance, bypass mechanism 402 can include a first terminal 404 and a second terminal 406 where first terminal 404 is coupled between negative output terminal 308 and PV sub-module 304a, and the second terminal 406 is coupled between positive output terminal 306 and PV sub-module 304f. In some instances, bypass mechanism 402 is only coupled to positive and negative output terminals 306 and 308 and two PV sub-modules 304a and 304f such that no other components within the circuit between positive and negative output terminals 306 and 308 are coupled to bypass mechanism 402. First terminal 404 can be coupled to negative output terminal 308 and second terminal 406 can be coupled to positive output terminal 306. In some embodiments, bypass mechanism 402 is configured so that current is only allowed to flow in direction 408, which is toward positive output terminal 306.

Bypass mechanism 402 can be configured to allow current to flow in one direction and prevent current from flowing in the opposite direction. This selective current flow can enable bypass mechanism 402 to minimize the chances of thermal events (e.g., arcing of electricity or overheating components) occurring in any of connections 310a-310g, whether it be related to degrading soldering joints, loose connectors, frayed cables, or any other faulty connection (i.e., electrical disturbance), thereby minimizing damage to electrical components within PV module sub-circuit 400 as well as to electrical components to which PV module sub-circuit 400 is coupled. The configuration at which bypass mechanism 402 selectively allows current to flow enables it to minimize the occurrence of thermal events. For instance, during operation, PV cells 302a-l in PV sub-modules 304a-f are generating power and current is flowing through connections 310a-g from negative output terminal 308 to positive output terminal 306 as designated by arrows 410 and 412. If there are no faulty connections from any of connections 310a-310g, then bypass mechanism 402 will not allow current to flow from first terminal 404 to second terminal 406, and power can continuously be provided by PV module sub-circuit 400 through terminals 306 and 308.

If a faulty connection is present, however, then bypass mechanism 402 will short the connection between terminals 306 and 308 to bypass PV module sub-circuit 400 before a thermal event can occur. Thus, electrical components within PV module sub-circuit 400 and to which PV module sub-circuit 400 is coupled are spared from damage that can be caused by a thermal event. For example, when a faulty connection is present, it causes an increase in resistance at the point of the faulty connection. This increase in resistance causes a corresponding increase in voltage across the point of resistance. The voltage generated by the faulty connection is opposite in polarity with respect to the polarity of the voltage generated by PV sub-modules 304a-304f. Accordingly, this flips the polarity of the voltage across output terminals 306 and 308, thereby causing positive output terminal 306 to have a negative voltage and negative output terminal 308 to have a positive voltage. This reversal in polarity causes bypass mechanism 402 to engage and allow current to flow between first and second terminals 404 and 406 of bypass mechanism 402 so that output terminals 306 and 308 are shorted. By shorting terminals 306 and 308, PV module sub-circuit 400 is bypassed and current can directly flow from negative output terminal 308 to positive output terminal 306 without passing through connections 310a-g.

In some embodiments, bypass mechanism 402 does not allow current to flow even if there is the presence of an opposite-polarity voltage caused by a faulty connection. In such cases, bypass mechanism 402 allows current to flow when the opposite-polarity voltage increases past a voltage threshold. The voltage threshold can be adjusted according to design, as different designs may wish to have different sensitivities to arcing. Higher voltage thresholds may result in lower arcing sensitivity, while lower voltage thresholds may result in higher arcing sensitivity. In some embodiments, the voltage threshold can be approximately 20 volts.

Figure 4B:
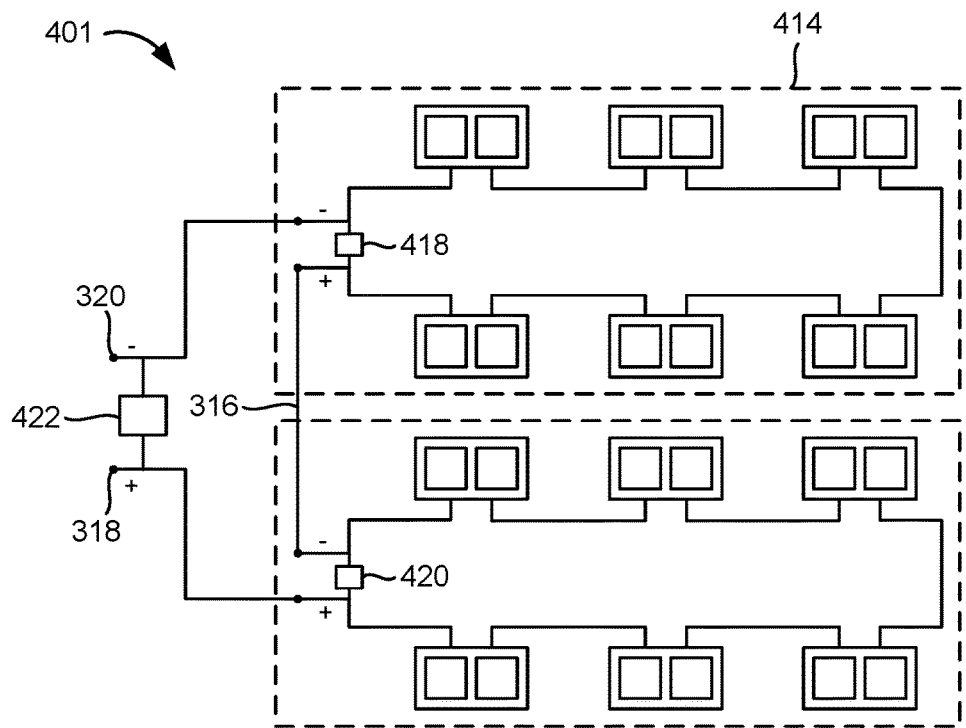
FIG. 4B is a simplified diagram illustrating a string configuration of PV module sub-circuits including a plurality of PV sub-modules and bypass mechanisms for an energy generation system, according to some embodiments of the present disclosure.

FIG. 4B is a simplified diagram illustrating a string configuration 401 of PV module sub-circuits 414 and 416 for an energy generation system. Similar to PV module sub-circuit 400, each PV module sub-circuit 414 and 416 can include a plurality of PV sub-modules, where each PV sub-module includes at least one PV cell as discussed herein with respect to FIG. 3A. PV module sub-circuits 414 and 416 can be coupled in a string so that the voltages provided by both PV module sub-circuits 414 and 416 can aggregate and provide a greater output voltage than an output voltage without aggregation. DC voltage generated by PV module sub-circuits 414 and 416 can be outputted to an inverter for converting to AC voltage or to an optimizer for performing maximum power point tracking (MPPT) before outputting to the inverter, which can then be outputted to one or more loads or the AC grid, as discussed herein with respect to FIG. 1.

Each PV module sub-circuit 414 and 416 can include a bypass mechanism for protecting connections between PV sub-modules. However, bypass mechanisms can also be incorporated in other parts of the PV system. For instance, a system bypass mechanism 422 can be positioned between terminals 320 and 318 to provide protection to connections between PV module sub-circuits 414 and 416. System bypass mechanism 422 can be similar in construction and function to bypass mechanism 402. It is to be appreciated that any number of bypass mechanisms can be incorporated between two terminals discussed herein to implement functions for protecting various connection components within an energy generation system.

A. Active Electronic Component

A bypass mechanism can be formed of any active electrical circuit, device, or component capable of allowing current to flow in one direction, but preventing current to flow in an opposite direction. For instance, bypass mechanism 412 can be a power electronic circuit that can sense a voltage and close a circuit to short output terminals 306 and 308 when the sensed voltage crosses a threshold, as shown in FIG. 5A.

Figure 5A:
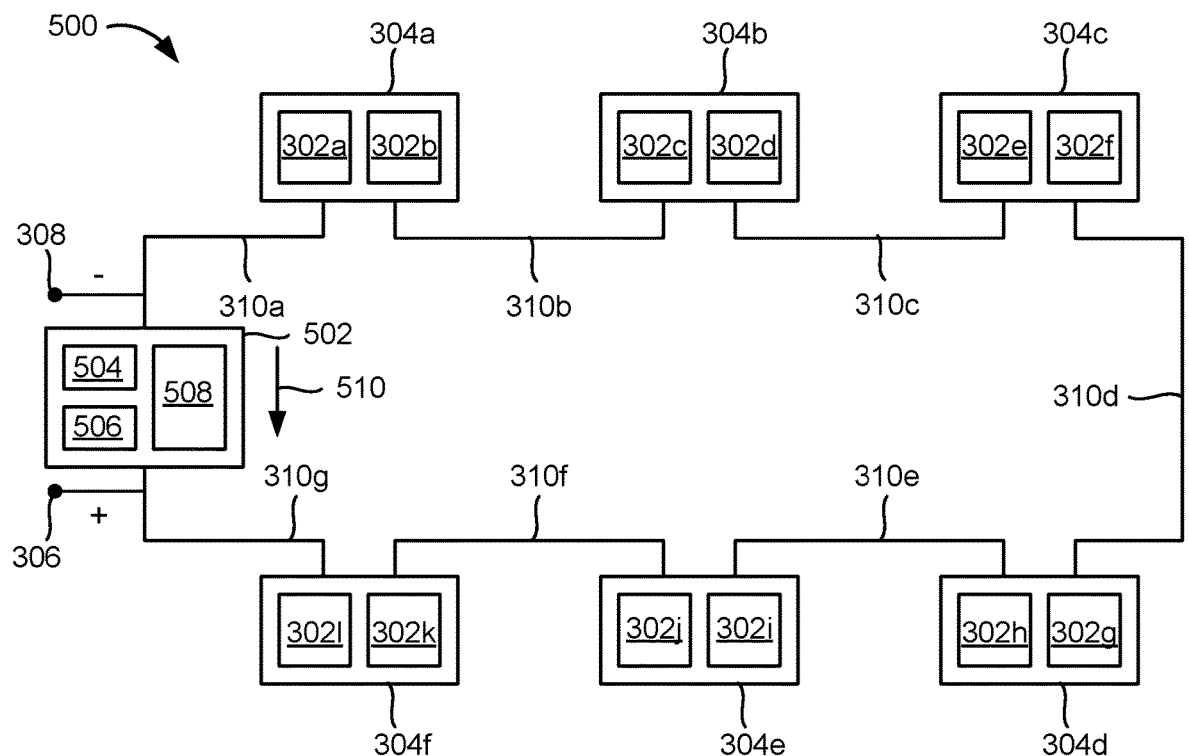
FIG. 5A is a simplified diagram illustrating a PV module sub-circuit having PV sub-modules and a bypass mechanism configured as a power electronic circuit, according to some embodiments of the present disclosure.

FIG. 5A is a simplified diagram illustrating a PV module sub-circuit 500 having a bypass mechanism 502 configured as a power electronic circuit, according to some embodiments of the present disclosure. Bypass mechanism 502 can include a sensor 504, switch 506, and a controller 508. Sensor 504 can be any suitable electronic component capable of measuring a voltage across bypass mechanism 502 such as a voltage sensor. Switch 506 can be any suitable electronic component suitable for opening and closing a circuit. For instance, switch 506 can be a metal oxide field effect transistor (MOSFET), bipolar junction transistor (BJT), electrical relay switch, and any other electronic component capable of opening and closing a circuit based on a control signal. Controller 508 can be any suitable electronic device containing a processor and memory that is configured to receive data from sensor 504 and control switch 506 in response to data received from sensor 504. For instance, if control 508 receives data from sensor 504 indicating that the voltage across bypass mechanism 502 has a polarity opposite that of the polarity between positive and negative output terminals 306 and 308, and that the voltage is greater than a voltage threshold (e.g., when an electrical disturbance occurs), then controller 508 can instruct switch 506 to close and short output terminals 306 and 308 so that PV module sub-circuit 500 is bypassed by allowing current to flow in direction 510 toward positive output terminal 306 through bypass mechanism 502. In some embodiments, PV module sub-circuit 500 is bypassed prior to actual occurrence of the thermal event so that electrical components within PV module sub-circuit 500 as well as electrical components to which PV module sub-circuit 500 is coupled are spared from damage, as discussed herein with respect to FIG. 4.

Although FIG. 5A illustrates sensor 504, switch 506, and controller 508 as housed within the same enclosure, embodiments are not so limited. Other embodiments can have each component, or groups of components housed in separate enclosures. Furthermore, bypass mechanism 502 does not have to be a standalone device that is solely dedicated to performing bypass functions as shown in FIG. 5A. Rather, bypass mechanism 502 can be incorporated in another electrical device that performs other functions, such as a micro-inverter, an optimizer, or any other electrical component that can be coupled between output terminals 306 and 308.

B. Passive Electronic Component

As discussed herein, a bypass mechanism can be an active electronic component that includes multiple electronic devices capable of actively performing different functions, but embodiments are not limited to such configurations. For instance, a bypass mechanism can be a passive electronic component that does not actively sense a voltage nor actively close a switch in response to a voltage measurement. Rather, as a passive electronic device, the bypass mechanism can be an electronic component that, by virtue of their construction, prevents current flow in one direction, but allows current to flow in an opposite direction when a voltage with a specific polarity and magnitude is present. One such device is a diode, as shown in FIG. 5B.

Figure 5B:
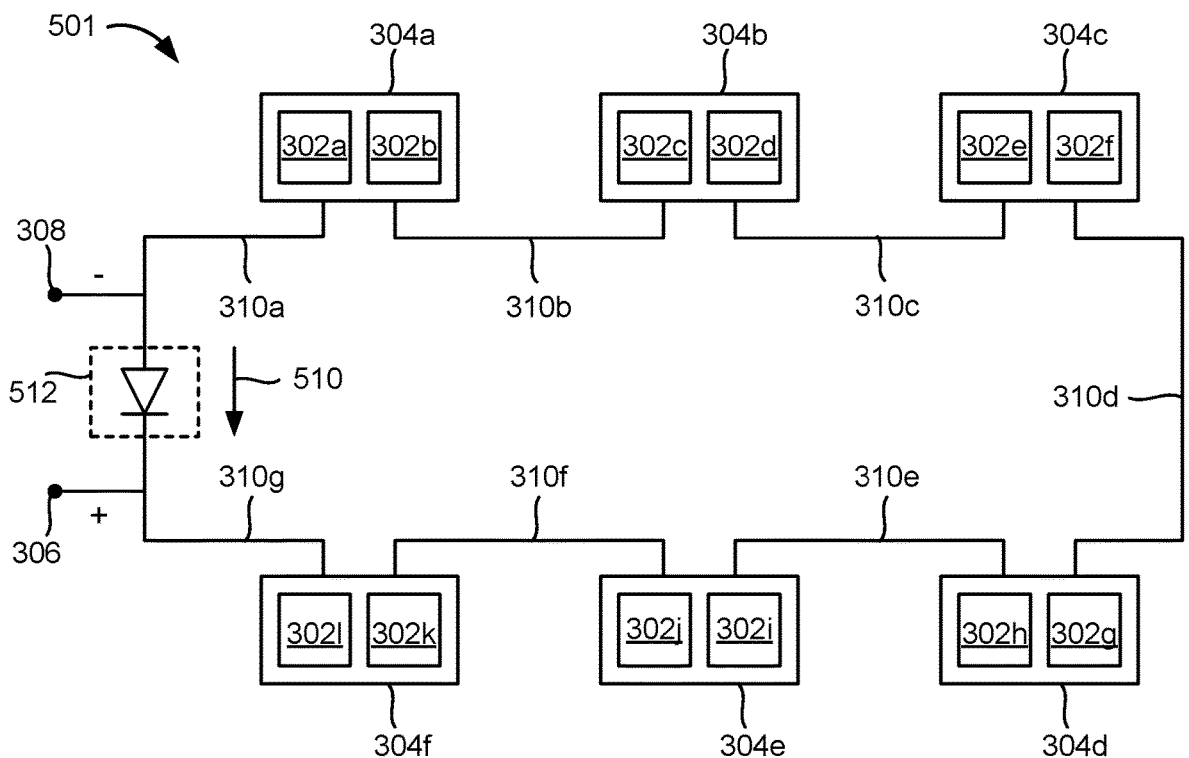
FIG. 5B is a simplified diagram illustrating PV module sub-circuit having PV sub-modules and a bypass mechanism that is configured as a diode, according to some embodiments of the present disclosure.

FIG. 5B is a simplified diagram illustrating PV module sub-circuit 501 having a bypass mechanism 512 that is configured as a diode, according to some embodiments of the present disclosure. When configured as a diode, bypass mechanism 512 can passively allow current to flow in one direction while preventing the flow of current in the opposite direction. For instance, bypass mechanism 512 can be oriented across output terminals 306 and 308 in a way that allows current to flow from negative output terminal 308 to positive output terminal 306, but prevent current flow from positive output terminal 306 to negative output terminal 308. In such cases, an anode of bypass mechanism 512 can be coupled to negative output terminal 308 and a cathode of bypass mechanism 512 can be coupled to positive output terminal 306.

IV. PV Module Sub-Circuits with Connectors

Embodiments aforementioned herein discuss bypass mechanisms for minimizing thermal events for PV module sub-circuits composed of PV sub-modules coupled together via cabled connections; however, embodiments are not limited to such configurations. Bypass mechanisms can be implemented in PV module sub-circuits whose PV sub-modules are coupled in various ways for the purpose of protecting against thermal events. For instance, in instances where PV sub-modules of a PV module sub-circuit are coupled together via cables and connectors, such as plug-and-socket connectors, bypass mechanisms can protect against thermal events associated with faulty connections between a plug and a socket in addition to faulty connections associated with cabled connections discussed herein.

Figure 6:
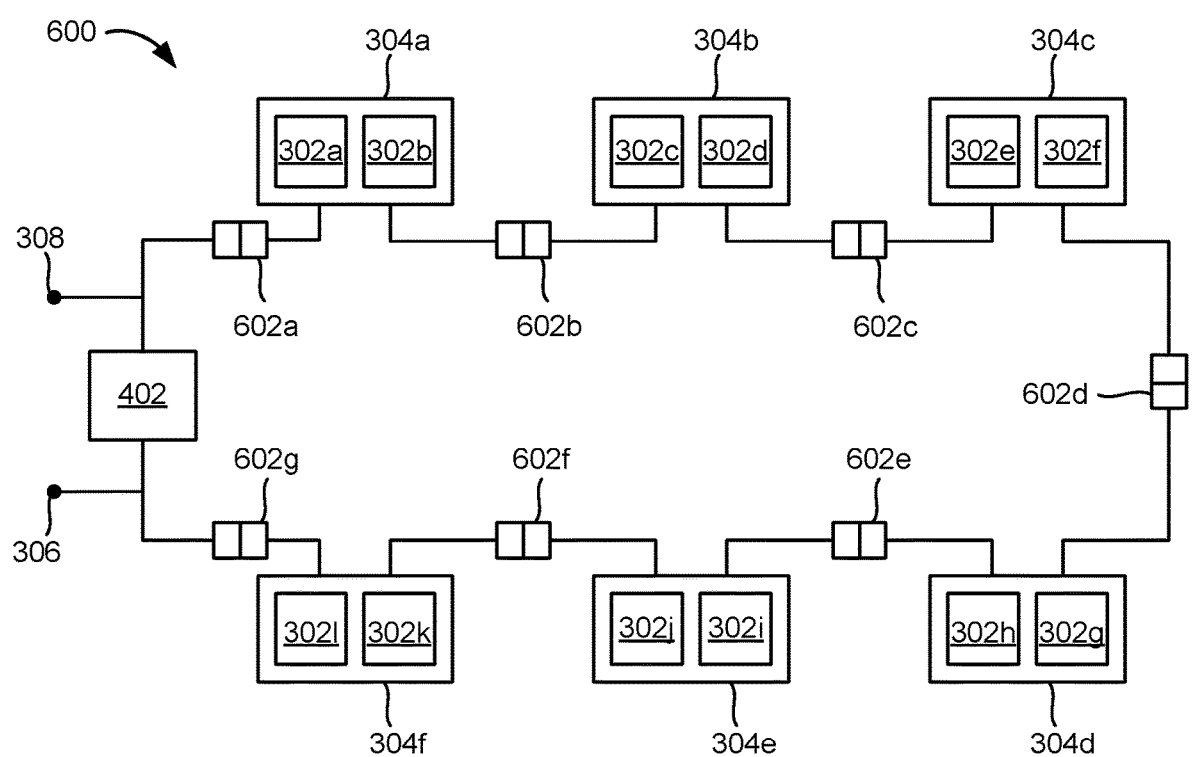
FIG. 6 is a simplified diagram illustrating an exemplary PV module sub-circuit including a bypass mechanism and PV sub-modules that are coupled together via cables and single-pole connectors, according to some embodiments of the present disclosure.

FIG. 6 is a simplified diagram illustrating an exemplary PV module sub-circuit 600 including bypass mechanism 402 and PV sub-modules 304a-f that are coupled together via cables and connectors 602a-g, according to some embodiments of the present disclosure. Connectors 602a-g can be connecting devices that form electrical connections between two devices. For instance, each connector 602a-g can be any suitable plug-and-socket-type connector that electrically and physically connects two cables together, such as a multi-contact (MC4) connector. Connectors 602a-g can be single-pole connectors as shown in FIG. 6, or dual-pole connectors as shown in FIG. 7.

Figure 7:
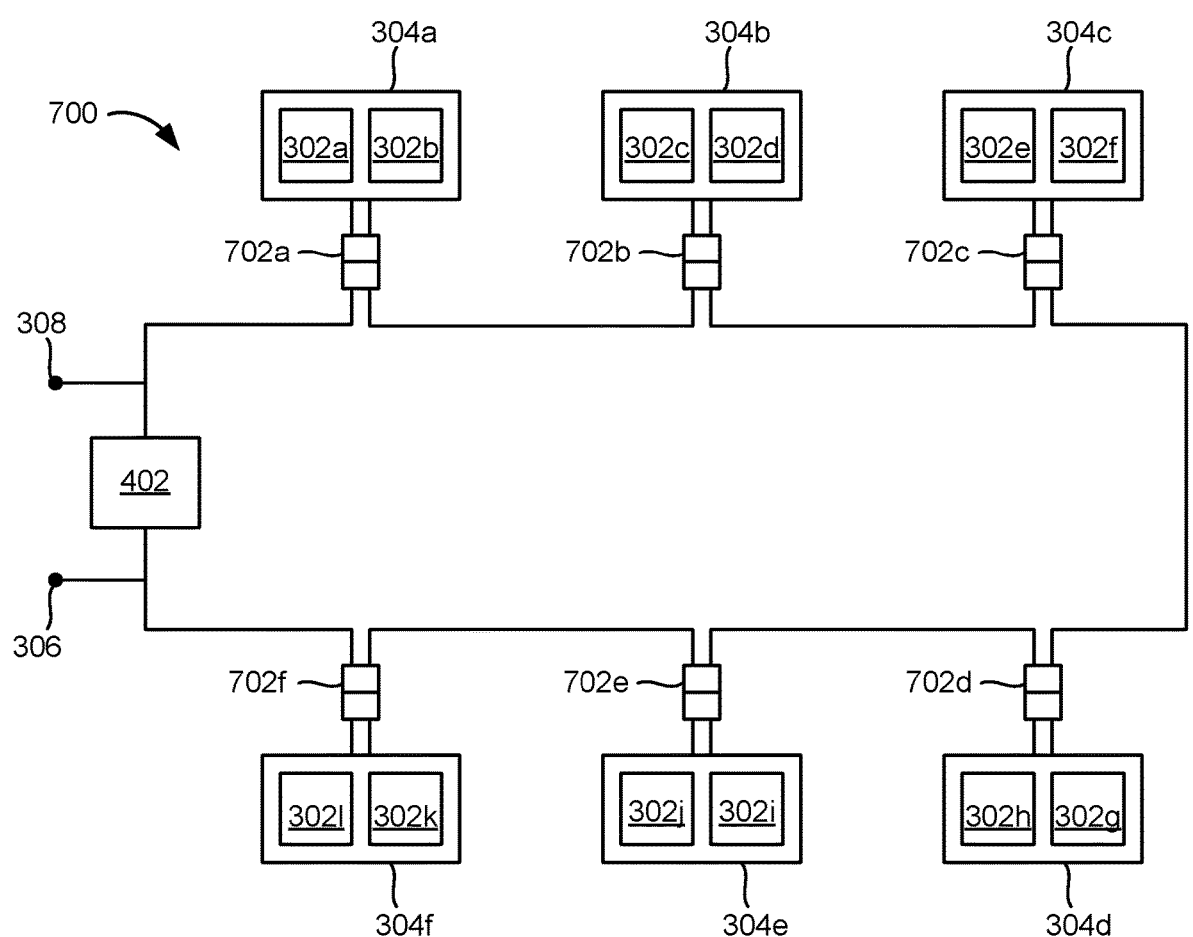
FIG. 7 is a simplified diagram illustrating an exemplary PV module sub-circuit including a bypass mechanism and PV sub-modules that are coupled together via cables and dual-pole connectors, according to some embodiments of the present disclosure.

FIG. 7 is a simplified diagram illustrating an exemplary PV module sub-circuit 700 including bypass mechanism 402 and PV sub-modules 304a-f that are coupled together via cables and connectors 702a-f, according to some embodiments of the present disclosure. Connectors 702a-f are dual-pole connectors that have two cables connected to each side of connectors 702a-f. Using dual-pole connectors only requires one avenue of entry/exit for the PV sub-component, which can enable the use of different sized PV sub-modules and different PV sub-module positions. For instance, in instances where space around an elongated PV sub-module only allows for a single avenue of entry/exit, then a dual-pole connector is suitable for coupling the PV sub-module to the energy generation system. In another instance, if a PV sub-module is at a border of an array of PV sub-modules where cables can only enter and exit from one side of the PV sub-module, then a dual-pole connector could be used.

Bypass mechanisms for PV module sub-circuits that utilize cables and connectors can protect against faulty connections (i.e., electrical disturbances) associated with both cable connections and connector connections that are capable of building up to a thermal event, e.g., arcing or overheating. For instance, bypass mechanism 402 can protect against defective soldering joints, corrosion, frayed cables, any other type of faulty connection associated with cables, and can also protect against incomplete mating of a connector, wear and tear from mechanical stresses associated with mating and un-mating a connector over time, corrosion, and any other type of faulty connection associated with connectors. By incorporating a bypass mechanism into PV module sub-circuits for an energy generation system, chances of a thermal event can be minimized, thereby increasing the reliability of the cables and connectors that couple the electrical devices together.

V. Connectors with Embedded Bypass Diodes

Embodiments aforementioned herein discuss a single bypass mechanism for protecting all of the connectors in a PV module sub-circuit; however, embodiments are not limited to such configurations. More than one bypass mechanism can be implemented in a PV module sub-circuit so that each connector is individually protected.

Figure 8A:
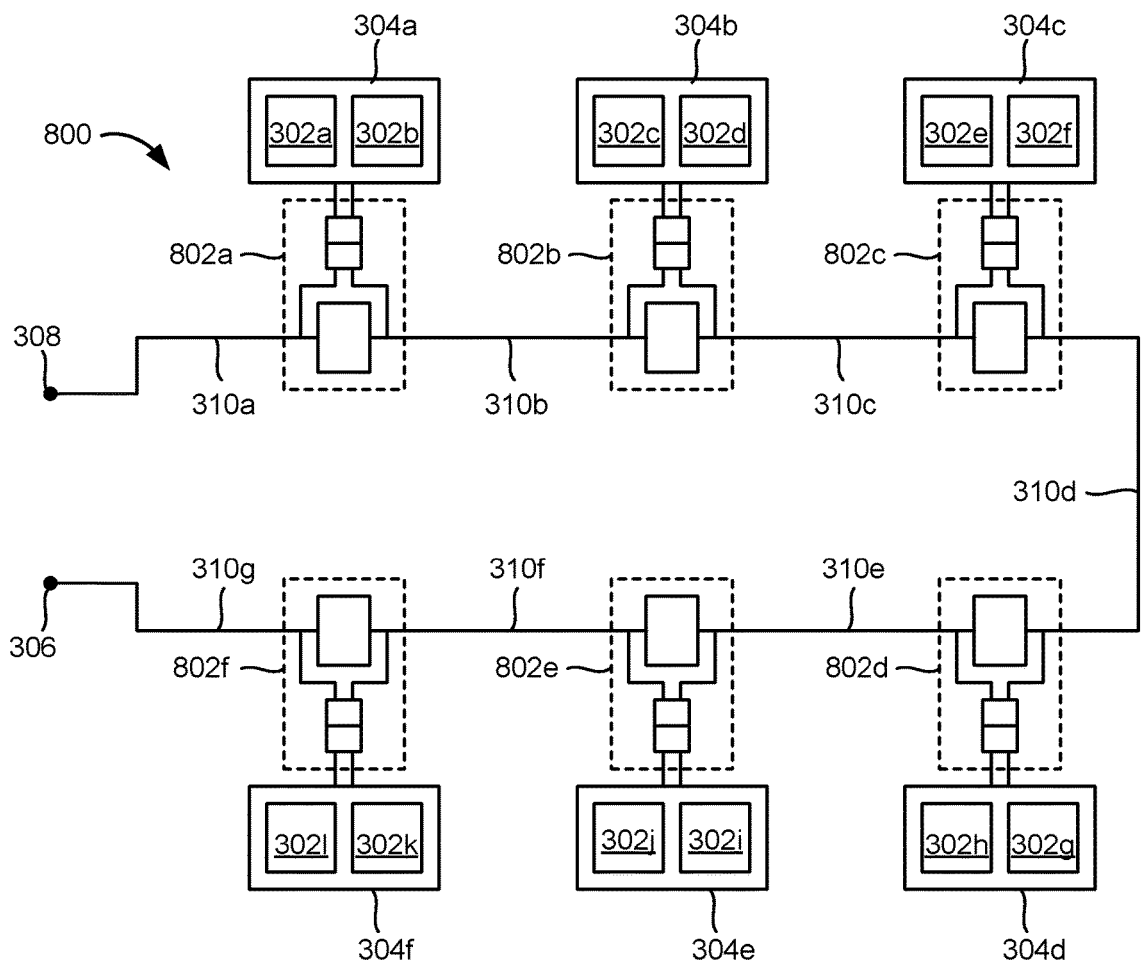
FIG. 8A is a simplified diagram illustrating a PV module sub-circuit having PV sub-modules and bypass connectors, according to some embodiments of the present disclosure.

FIG. 8A is a simplified diagram illustrating a PV module sub-circuit 800 having bypass connectors 802a-f, according to some embodiments of the present disclosure. Bypass connectors 802a-f can be dual-pole connectors that are positioned similarly to the dual-pole connectors in FIG. 7. However, bypass connectors 802a-f can be configured to perform not only electrical connection, but also perform bypass functions in the case of an electrical disturbance due to a faulty connection. Details of bypass connectors 802a-f are discussed herein with respect to FIG. 8B.

Figure 8B:
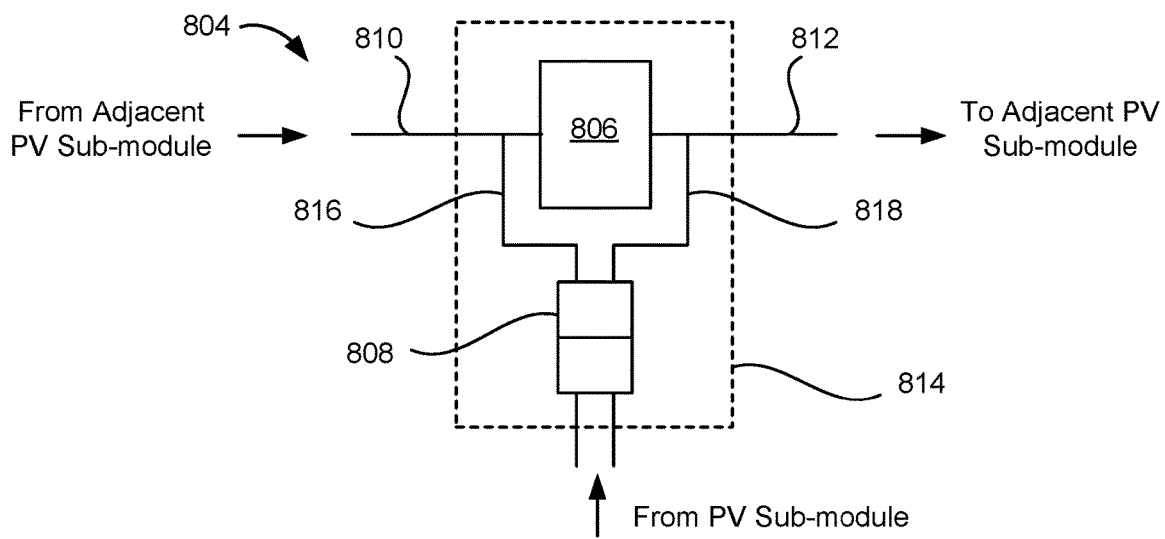
FIG. 8B is a simplified diagram illustrating a single bypass connector, according to some embodiments of the present disclosure.

FIG. 8B is a simplified diagram illustrating a zoomed-in view of a single bypass connector 804 (i.e., any of bypass connectors 802a-f in FIG. 8A), according to some embodiments of the present disclosure. As shown, bypass connector 804 includes a bypass mechanism 806 coupled between cables 810 and 812 that route power to and from adjacent PV sub-modules, and a connector 808 for electrically coupling a PV sub-module to adjacent PV sub-modules through cables 810 and 812. Bridging connections 814 and 816 can couple cables 810 and 812 to PV sub-module to route power from the PV sub-module to cables 810 and 812. Bypass mechanism 806 can be configured to allow current to flow from cable 810 to cable 812 (bypassing connector 808) in the event of an electrical disturbance. Bypass mechanism 806 can be an active component or a passive component that allows current flow in one direction but prevents current flow in the opposite direction, as discussed herein with respect to FIGS. 5A and 5B. The voltage threshold at which bypass mechanism 806 turns on, however, can be smaller than the voltage threshold of bypass mechanism 402 in FIG. 4A because bypass mechanism 806 only needs to protect one connector (i.e., connector 808). In some embodiments, the voltage threshold is approximately 5 volts. Bypass mechanism 806 and connector 808 can be housed within an enclosure 814 that is used to couple a PV sub-module to a string of PV sub-modules in a PV module sub-circuit. Housing these components within the same enclosure eases installation and results in a simpler design. Using bypass connectors 804 in a PV module sub-circuit enables protections discussed herein to each individual connector, thereby allowing the PV module sub-circuit to continue providing power even in the event of an electrical disturbance related to a single connector.

Although the invention has been described with respect to specific embodiments, it will be appreciated that the invention is intended to cover all modifications and equivalents within the scope of the following claims.

What is claimed is:

1. A photovoltaic (PV) module string for an energy generation system comprising:
   a plurality of PV module sub-circuits, each PV module sub-circuit of the plurality of PV module sub-circuits comprising:
      a plurality of PV sub-modules coupled together via external cables, the plurality of PV sub-modules comprising a first PV sub-module and a second PV sub-module;
      a negative output terminal coupled to the first PV sub-module of the plurality of PV sub-modules;
      a positive output terminal coupled to the second PV sub-module of the plurality of PV sub-modules;
      a plurality of connectors external to the PV sub-modules and coupling the PV sub-modules together to form the PV module sub-circuit so that a current flows through the connectors and the external cables during energy generation; and
      a sub-circuit bypass mechanism comprising a first terminal coupled to only the negative output terminal and the first PV sub-module, and a second terminal coupled to only the positive output terminal and the second PV sub-module, the sub-circuit bypass mechanism configured to prevent current flow in a first direction and allow current flow in a second direction opposite of the first direction when a voltage across the sub-circuit bypass mechanism increases above a first voltage threshold to prevent an occurrence of a thermal event; and
   a system bypass mechanism coupled to the negative output terminal of a first PV module sub-circuit of the plurality of PV module sub-circuits and to the positive output terminal of a second PV module sub-circuit of the plurality of PV module sub-circuits, the system bypass mechanism configured to prevent current flow in a third direction and allow current flow in a fourth direction opposite of the third direction when a voltage across the system bypass mechanism increases above a second voltage threshold.

2. The PV module string of claim 1, wherein the sub-circuit bypass mechanism is a passive electrical device.

3. The PV module string of claim 2, wherein the passive electrical device is a diode.

4. The PV module string of claim 3, wherein an anode of the diode is coupled to the negative output terminal and a cathode of the diode is coupled to the positive output terminal.

5. The PV module string of claim 1, wherein the bypass mechanism is an active electrical device.

6. The PV module string of claim 5, wherein the bypass mechanism is a power electronic circuit.

7. The PV module string of claim 6, wherein the power electronic circuit comprises a sensor, a switch, and a controller coupled to the sensor and the switch and configured to control the switch based on data received from the sensor.

8. The PV module string of claim 6, wherein the power electronic circuit is incorporated in an optimizer for performing maximum power point tracking of power outputted by the plurality of PV sub-modules.

9. The PV module string of claim 1, wherein each of the PV sub-modules comprises at least two PV cells.

10. The PV module string of claim 1, wherein the PV sub-module is a PV shingle that has a structure and an appearance of a roof shingle.

11. The PV module string sub-circuit of claim 1, wherein the thermal event is an occurrence of an electrical arcing or overheating.

12. A building-integrated photovoltaic (PV) energy generation system comprising:
- a plurality of PV module sub-circuits coupled together and configured to output power to a pair of terminals, each PV module sub-circuit comprising:
  - a plurality of PV sub-modules coupled together via external cables, the plurality of PV sub-modules comprising a first PV sub-module and a second PV sub-module;
  - a negative output terminal coupled to the first PV sub-module of the plurality of PV sub-modules;
  - a positive output terminal coupled to the second PV sub-module of the plurality of PV sub-modules;
  - a plurality of connectors external to the PV sub-modules and coupling the PV sub-modules together to form the PV module sub-circuit so that a current flows through the connectors and the external cables during energy generation; and
  - a sub-circuit bypass mechanism comprising a first terminal coupled to only the negative output terminal and the first PV sub-module, and a second terminal coupled to only the positive output terminal and the second PV sub-module, the bypass mechanism configured to prevent current flow in a first direction and allow current flow in a second direction opposite of the first direction when a voltage across the sub-circuit bypass mechanism increases above a voltage threshold;
- a system bypass mechanism coupled to the negative output terminal of a first PV module sub-circuit of the plurality of PV module sub-circuits and to the positive output terminal of a second PV module sub-circuit of the plurality of PV module sub-circuits, the system bypass mechanism configured to prevent current flow in a third direction and allow current flow in a fourth direction opposite of the third direction when a voltage across the system bypass mechanism increases above a second voltage threshold; and
- an inverter coupled to the plurality of PV module sub-circuits via the pair of terminals and configured to receiver power from the plurality of PV module sub-circuits.

13. The energy generation system of claim 12, wherein the sub-circuit bypass mechanism is a diode.

14. The energy generation system of claim 13, wherein an anode of the diode is coupled to the negative output terminal of the PV module sub-circuit and a cathode of the diode is coupled to the positive output terminal of the PV module sub-circuit.

15. The energy generation system of claim 12, wherein the sub-circuit bypass mechanism is a power electronic circuit.

16. The energy generation system of claim 15, wherein the power electronic circuit comprises a sensor, a switch, and a controller coupled to the sensor and the switch and configured to control the switch based on data received from the sensor.

17. The energy generation system of claim 12, wherein each of the PV sub-modules comprises at least two PV cells.

18. The energy generation system of claim 12, wherein each of the PV sub-modules is a PV roof tile that has a structure and an appearance of a roof tile.

19. The energy generation system of claim 12, wherein the sub-circuit bypass mechanism is configured to prevent an occurrence of a thermal event caused by electrical arcing or overheating.

* * * * *